US009313907B2

(12) United States Patent
Heimerl

(10) Patent No.: US 9,313,907 B2
(45) Date of Patent: Apr. 12, 2016

(54) MODULAR HOUSING SYSTEM
(71) Applicant: MECOMO AG, Unterschleiβheim (DE)
(72) Inventor: Stefan Heimerl, Landshut (DE)
(73) Assignee: MECOMO AG, Unterschleissheim (DE)
(*) Notice: Subject to any disclaimer, the term of this patent is extended or adjusted under 35 U.S.C. 154(b) by 0 days.
(21) Appl. No.: 14/398,096
(22) PCT Filed: May 7, 2013
(86) PCT No.: PCT/DE2013/100169
§ 371 (c)(1),
(2) Date: Oct. 30, 2014
(87) PCT Pub. No.: WO2013/170851
PCT Pub. Date: Nov. 21, 2013
(65) Prior Publication Data
US 2015/0156903 A1 Jun. 4, 2015
(30) Foreign Application Priority Data
May 16, 2012 (DE) .......................... 10 2012 104 272
(51) Int. Cl.
*H05K 5/02* (2006.01)
*H05K 5/03* (2006.01)
(52) U.S. Cl.
CPC ............ *H05K 5/0221* (2013.01); *H05K 5/0204* (2013.01); *H05K 5/0208* (2013.01); *H05K 5/03* (2013.01)
(58) Field of Classification Search
CPC ........................... H05K 5/0204; H05K 5/0221
See application file for complete search history.

(56) References Cited
U.S. PATENT DOCUMENTS 5,057,971 A * 10/1991 Hautvast .............. H05K 5/0065
174/59
5,226,823 A * 7/1993 Johnson ................. H05K 7/023
439/66
5,788,347 A * 8/1998 Rabinovitz ......... A47B 87/0215
312/111
6,038,130 A * 3/2000 Boeck .................. H01R 9/2675
361/729
6,201,698 B1 * 3/2001 Hunter ................. H05K 7/1435
361/704
7,450,083 B1 11/2008 Baker
2003/0082955 A1 5/2003 Zaderej et al.
2012/0134129 A1 5/2012 Josefiak et al.
2014/0177181 A1 * 6/2014 Malek .................... H05K 9/003
361/749

FOREIGN PATENT DOCUMENTS

DE 1139998 4/1958
DE 102005021502 11/2006

* cited by examiner

*Primary Examiner* — Hung V Ngo
(74) *Attorney, Agent, or Firm* — Duane Morris LLP; J. Rodman Steele, Jr.; Gregory M. Lefkowitz

(57) ABSTRACT

The invention relates to a modular housing system for accommodating electronic circuits, in particular telematics units. Said system comprises at least one basic housing module (10) which has two opposite end faces, wherein on the first end face, a first connecting plate (11) is formed in a first plane and a second connecting plate (12) is formed in a second plane which is different from the first plane; on the second end face, a third connecting plate (13) is formed in the first plane and a fourth connecting plate (14) is formed in the second plane. The first and third connecting plates (11, 13) and the second and fourth connecting plates (12, 14) are respectively formed on the end faces thereof in such a way that a positive engagement can be achieved at least in part, and the first and fourth connecting plates (11, 14) each have at least one opening (0) into which a locking element (60) can be respectively introduced.

21 Claims, 7 Drawing Sheets

MODULAR HOUSING SYSTEM

CROSS-REFERENCE TO RELATED APPLICATIONS

This application is a §371 national stage entry of International Application No. PCT/DE2013/100169, flied May 7, 2013, which claims priority to German Patent Application No. 10 2012 104 272.1, filed May 16, 2012, the entire contents of which are incorporated herein by reference.

The present invention relates to a modular housing system for accommodating electronic circuits and in particular to a modular housing system for telematics units.

The term telematics is to be understood below in particular as a technology which is used within the area of safety technology, fleet management, logistics and tele control and in particular links means of telecommunication and information technology together. Telematics units can comprise, for example, a position finding unit as well as a telecommunications unit for transmitting the detected location data to a computer or data processing unit that is present in a communication network.

For example, transport containers are usually provided with mobile telematics units for the monitoring of said transport containers. In this connection, a current position of the transport container that is provided with the telematics unit can be detected by means of a mobile network interface module or a GPS module and transmitted to the central data processing unit. In addition, the telematics unit can comprise sensors which detect status data of the transport container or of the contents thereof, the status data being able to deposited locally in a data storage unit and/or transmitted to the central data processing unit. In addition, an evaluating module can be provided in the telematics unit for evaluating the detected data. For operating the different electronic circuit modules, the telematics unit also has a power supply unit which is realized, for example, by means of a battery, an accumulator or a solar panel.

Consequently, these types of telematics units can comprise a plurality of different circuit modules which have to be combined and mounted on the transport container differently depending on the area of application.

Document WO 2011/018282 A1 makes known an accommodating device for a modular telematics unit, it being possible to insert at least one housing for the circuit modules an well as a solar panel into a holding rail. An extension of the telematics unit is consequently possible only in the direction of the holding rail.

Accordingly, the object underlying the invention is to create a modular housing system for accommodating electronic circuits, said modular housing system having increased flexibility.

According to the invention, said object in achieved by the features of claim 1.

According to the invention, a modular housing system for accommodating electronic circuits comprises at least one basic housing module which comprises two oppositely located end faces, wherein a first connecting plate is realized in a first plane on the first end face and a second connecting plate is realized in a second plane which is different from the first plane, wherein a third connecting plate is realized in the first plane on the second end face and a fourth connecting plate is realized in the second plane, wherein in each case the first and third connecting plate as well as the second and fourth connecting plate are formed on their end faces in such a manner that positive locking can be realized at least in part, and wherein the first and fourth connecting plate comprise in each case at least one opening into which in each case a locking element can be introduced. The housing system according to the invention consequently has increased flexibility as it can be combined and extended in a two-dimensional manner, i.e. in the vertical and in the horizontal direction. The housing system, as a result, is both stackable and extendible in both directions. At the same time, a very sturdy and torsion-resistant interconnection is realized.

The first and fourth connecting plate can preferably comprise in each case a convex form and the second and third connecting plate can comprise in each case a concave form, as a result of which, when they are joined together, a self-adjusting system is produced which over and above this comprises improved mechanical characteristics and in particular increased torsion resistance.

For example, at least one passage for realizing an electric plug connection and/or a cable duct between adjacent basic housing modules can be provided on the end faces of the basic housing module, as a result of which extension also with respect to the electrical lines is made possible in a very simple manner.

The first and second connecting plate as well as the third and fourth connecting plate can preferably be arranged directly one above the other, as a result of which simpler joining together during assembly is produced (place module at an angle at the connecting point and fold down).

The locking element can preferably provide a thru shaft with a circular, oval or polygonal cross section. The costs for the housing system, on the one hand, and the expenditure on assembly when constructed on site, on the other hand, can be reduced in a considerable manner as a result.

There can additionally be provided a housing cover which covers the housing module, wherein, on its end faces, the housing cover comprises in each case only one connecting plate which, with regard to its form, corresponds to the second and fourth connecting plate. The components arranged in the housing module can be packaged in a water-proof and dust-proof manner as a result.

In this connection, the basic housing module can comprise on its side faces at least one first recess and the housing cover can comprise at least one associated clamping bracket, therein the housing cover can be fastened on the basic housing module as a result of engaging the at least one clamping bracket in the at least one recess of the basic housing module. The opening and closing of the housing module is made considerably easier as a result.

In addition, a frame module can be provided for accommodating a flat electronic component, wherein the frame module comprises on its end faces in each case two connecting plates which, with regard to their form, correspond to the first to fourth connecting plate. As a result, the components accommodated in the housing module can be supplemented in a very simple manner with, for example, output units and/or input units.

In this connection, the basic housing module can additionally comprise on its side faces at least one second recess and the frame module can comprise at least one associated clamping bracket, wherein the frame module is fastened on the basic housing module as a result of engaging the at least one clamping bracket in the at least one second recess of the basic housing module. This further simplifies assembly.

The flat electronic component can preferably comprise a solar panel, wherein the frame module additionally comprises ventilating slots for venting the solar panel and for thermally decoupling the further modules. A self-sufficient power supply and at the same time reliable cooling of the solar panels can be ensured in this way.

There can additionally be provided a cover module, in particular a Plexiglas sheet, for realizing mechanical protection which comprises at least two openings into which in each case the locking element can be introduced. As a result, additional vandal-resistant protection can be mounted very simply as an option on the already mounted housing system.

There can additionally be provided a fastening module for realizing a fastening of the housing system on a supporting surface which comprises at least two openings into which in each case the locking element can be introduced. A flexible and simple fastening possibility is obtained for the housing system according to the invention as a result.

The fastening module preferably comprises on its end faces in each case two connecting plates which, with regard to their form, correspond to the first to fourth connecting plate. As a result, a plurality of fastening modules can also be meshed in one another, as a result of which an overall length of the fastening can be adjusted in an arbitrary manner.

For example, the fastening module can comprise proximity sensors for detecting a presence of the supporting surface and releasable fastening elements for releasably fastening the fastening module on the supporting surface. On the one hand anti-theft protection and on the other hand rapid assembly can be realized as a result.

The fastening module is preferably divided into four quadrants, wherein all the fastening elements are arranged in one predetermined quadrant. As a result, an overlapping installation, e.g. on transport containers, can be made possible which additionally enables the opening and closing of doors.

In this connection, at least two proximity sensors can be arranged in the predetermined quadrant and at least one proximity sensor can be arranged in the quadrant that is located opposite in a point symmetrical manner, as a result of which door monitoring can be realized in addition to reliable anti-theft monitoring for the housing system.

Further advantageous developments of the invention are characterized in the further subclaims.

The invention is described in more detail below by way of exemplary embodiments with reference to the drawing, in which.

Figure 6:
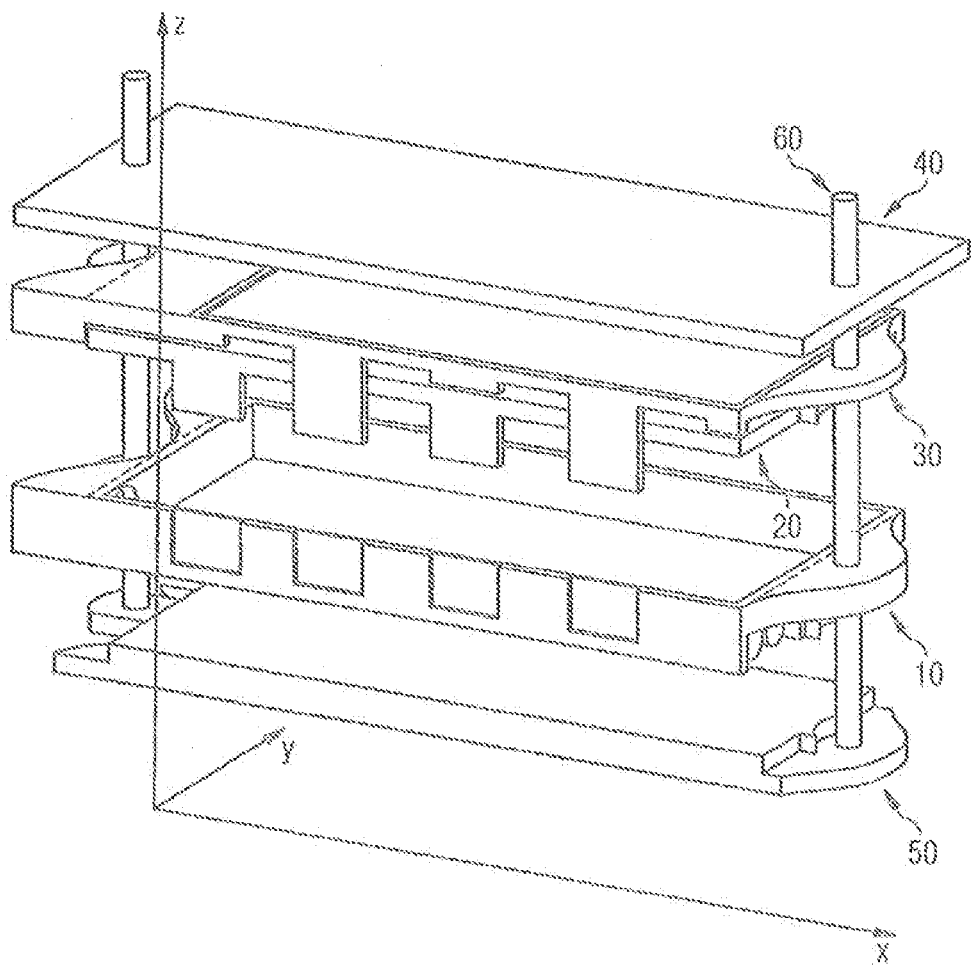
Figure 7:
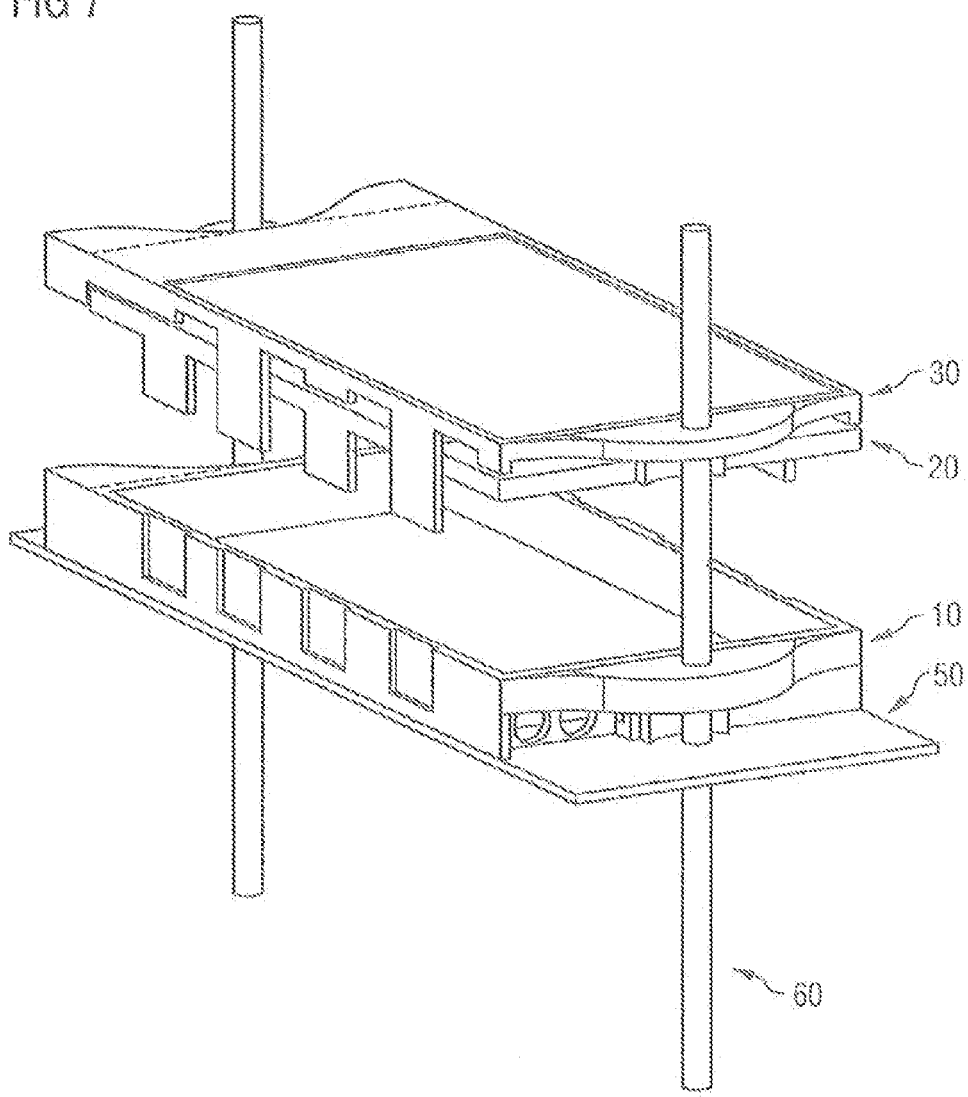

FIG. 6 shove a simplified perspective view of a modular housing system according to a further exemplary embodiment; and FIG. 7 shows a simplified perspective view of a modular housing system according to a further exemplary embodiment.

The present invention includes, in particular, a modular housing system for telematics units, the individual modules of which being able to be linked together simply and flexibly in the manner of a modular system.

The housing system can be mounted, for example, both on the inside and the outside on the top surface, on one side or on the doors of a so-called transport container. Modular extension or stacking in the groove-shaped indentations or beads of a transport container or a so-called swap body is preferably made possible by the housing system, although the housing system is also mountable without the presence of indentations.

Figure 1:
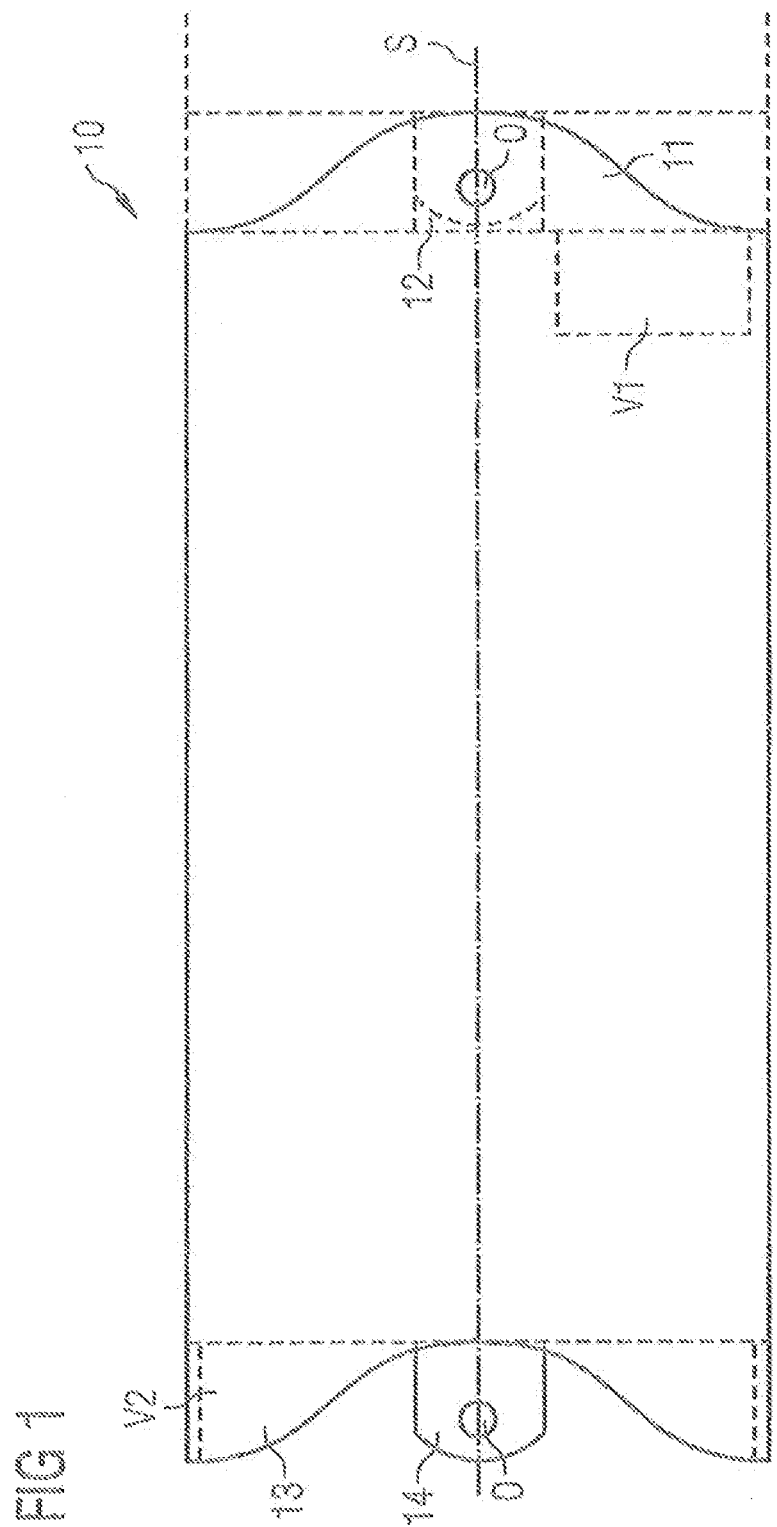
FIG. 1 shows a simplified top view of a basic housing module according to a first exemplary embodiment.

FIGS. 1 and 6 show a simplified top view of a basic housing module 10 as well as the use of a basic housing module 10 of this type in a modular housing system according to a first exemplary embodiment of the present invention.

According to FIG. 1, the basic housing module 10 can comprise a substantially cuboid housing body in which electronic components or circuits and in particular telematics units (not shown) can be arranged. These can be, for example, an accumulator or a battery for the power supply, a GPS module (Global Positioning Systems) for detecting location data, sensors for detecting status data of the transport container, of the contents thereof or of the housing system, an evaluating unit for evaluating the data detected and/or a radio module, such as, for example, a GSM module, for connection to a central data processing unit via, for example, a mobile radio network. In addition, arbitrary further electronic circuits can be realized on circuit boards which can be arranged in the basic housing module 10.

The height of the basic housing module 10, for example, can be between 1 cm and 3 cm and its width can be between 6 cm and 13 cm. The length of the basic body is basically freely selectable, for example a length of between 10 cm and 35 cm being used. A height of the basic housing module 10 is preferably approximately 2.5 cm, a width is approximately 9 cm and a length is approximately 20 cm. The basic housing module 10 can have a material thickness for the bottom and wall region of, for example, between 2 mm and 5 mm and consists, for example, of material that is not electrically conductive in order not to impair signal reception of the radio module or of the GPS module. For example, a mechanically high-strength and temperature-resistant plastics material which is additionally stable as regards sunlight is used. Thus ensures that it withstands the most varied environmental influences in a reliable manner.

As an alternative to this or in addition to it, however, the basic housing module 10 can also consist of a material that is electrically conductive such as, for example, aluminum, or is coated with a material that is electrically conductive, as a result of which HF-sensitive circuit modules are able to be shielded in a targeted manner from electromagnetic interference.

The substantially cuboid basic housing module 10 preferably comprises a form that is adapted to the groove-shaped indentation or bead of the transport container or the swap body. As these types of groove-shaped indentations or beads of the transport container or of the swap body are developed in a trapezoidal manner as regards their cross section, the basic housing module 10 or the entire housing system can accordingly also comprise a trapezoidal cross section that has been adapted to the groove-shaped indentations or beads. The side walls can accordingly be developed not only at right angles but also inclinedly outward, i.e. widening outward. As a result, even in the case of a small footprint or base area, a maximum interior can be provided for respective components.

According to FIG. 1, the substantially cuboid basic housing module 10 comprises at its oppositely located end faces in each case two connecting plates 11 and 12 as well as 13 and 14 which are realized in each case in different planes. As shown in FIG. 6, a first connecting plate 11 can be realized, for example, in the upper half of the end face, whilst the second connecting plate 12 is realized in the bottom half of the end face. The first and second connecting plate 11 and 12, in this connection, can in each case comprise a thickness which, taken together, corresponds to a height of the basic housing module, as a result of which is ensured that the connecting plates are able to be arranged directly one on top of the other. Consequently, there is preferably no space between the connecting plates, rather the respective connecting plates contact each other directly. For the case where several basic housing modules are stacked one on top of another, the connecting plates of the stacked modules are also arranged directly one on top of another. This enables rapid and simple assembly, play-free fastening being realized in the vertical direction (z direction).

With regard to the top view thereof, the first connecting plate 11 according to FIG. 1 can comprise substantially a convex form which projects in a semi-circular manner out of the end face and approaches the side faces of the basic housing module 10 in an asymptotic manner. In contrast, the second connecting plate 12 can provide a projection, the end face of which comprises a concave form. For example, the first connecting plate comprises at least one opening O into which at least one locking element 60 can be introduced. According to FIG. 1, precisely one opening O can be realized in such a manner in the first connecting plate 11 that it lies substantially on the axis of symmetry S of the basic housing module 10. In addition, the second connecting plate 12 can be realized in such a manner that it is at a sufficient spacing from the opening O. The opening O can preferably be realized in such a manner that it lies on the axis of symmetry S halfway along between the end faces of the first and second connecting plates 11 and 12. Although the second connecting plate 12, in principle as the first connecting plate 11, can be formed over the entire width of the end face of the basic housing module 10, it preferably has a smaller width than the basic housing module 10, as a result of which the possibility for contact and passage openings D in the longitudinal direction is provided at its side. In particular, at the side next to the second connecting plate 12 can be realized so-called indentations V1 in which can be realized at least one passage D which, in turn, enables a cable duct or a plug connection between adjacent modules. The passage D, in this connection, preferably meets protection class IP69k.

According to FIG. 1, the basic housing module 10 comprises on its oppositely located end face a third and fourth connecting plate 13 and 14 which are each realized in the same plane as the first and second connecting plate 11 and 12 and are formed at their end faces in such a manner that they realize positive locking with the end faces of the first and second connecting plates 11 and 12 at least in part. More precisely, the third connecting plate 13 has a concave form which corresponds precisely to the first connecting plate 11, whilst the fourth connecting plate 14 has a convex form which corresponds precisely to the second connecting plate 12. A further opening O, in this connection, is realized in the fourth connecting plate 14 in such a manner that after two basic housing modules 10 according to the invention have been joined together and locked as a result of inserting a locking element 60, a connection that is play-free in the vertical and horizontal direction can be realized.

For this purpose, the third and fourth connecting plate 13 and 14 comprise forms which are correspondingly inverted with respect to the first and second connecting plate 11 and 12. Once again, an indentation (not shown) and in particular one or several passages D can also be realized on the second end face for realizing an electric plug connection and/or a cable duct. A seamless transition between the adjoining modules in the case of horizontal extension can preferably be achieved in the coupling region as a result of extending the length of the side walls of the basic housing module 10. As a result, in particular cables or sensitive elements (such as, for example, sensors) can be protected in the coupling region.

The locking element 60 can be realized, for example, as a thru shaft with a circular cross section. As an alternative to this, however, thru shafts with an oval or polygonal cross section can also be used. Metal thru shafts which have a particularly strong mechanical strength can preferably be used. As an alternative to this, however, thru shafts produced from other materials and in particular from plastics material can also be used. Although always only one thru shaft per connecting region is shown in the figures, two or more thru shafts or locking elements 60 can also be used per connecting region.

In this way, a plurality of basic housing modules 10 can be connected together in stacked or extended form in a sturdy and precise manner. In addition, the vertical connections can be supported (stacked) at the corners of the basic housing module 10 by means of fixing points (not shown). As a result of using the semi-circular molded parts according to the invention for the connecting plates 11 to 14 on both end faces of the basic housing module 10, a suitably accurately fitting connection that is torsion-resistant in the horizontal (x) direction is obtained. The sturdiness and ease of assembly of the housing system is considerably increased as a result.

Figure 2:
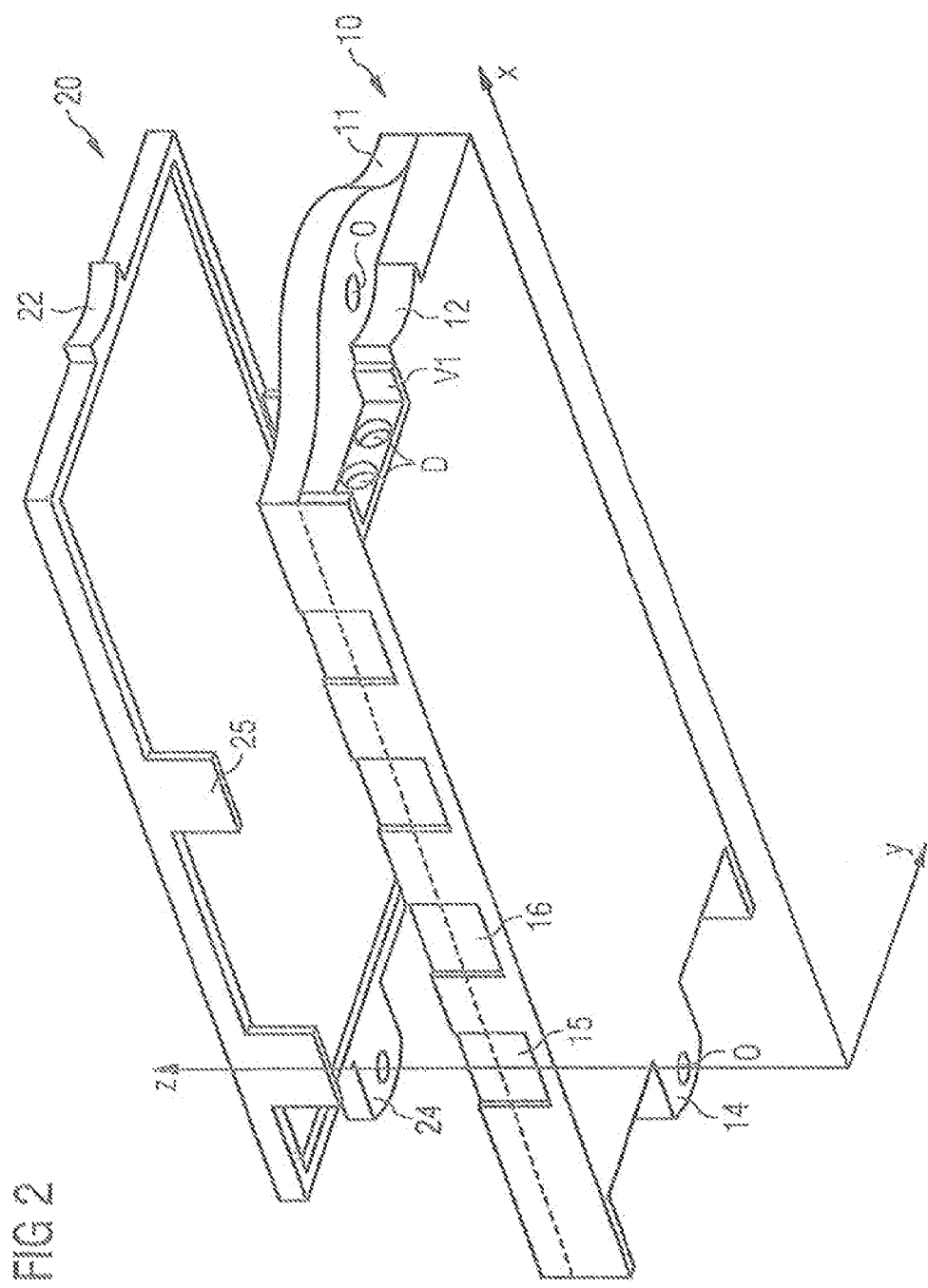
FIGS. 2 and 3 show simplified perspective views of the basic housing module according to FIG. 1 with a housing cover.
Figure 3:
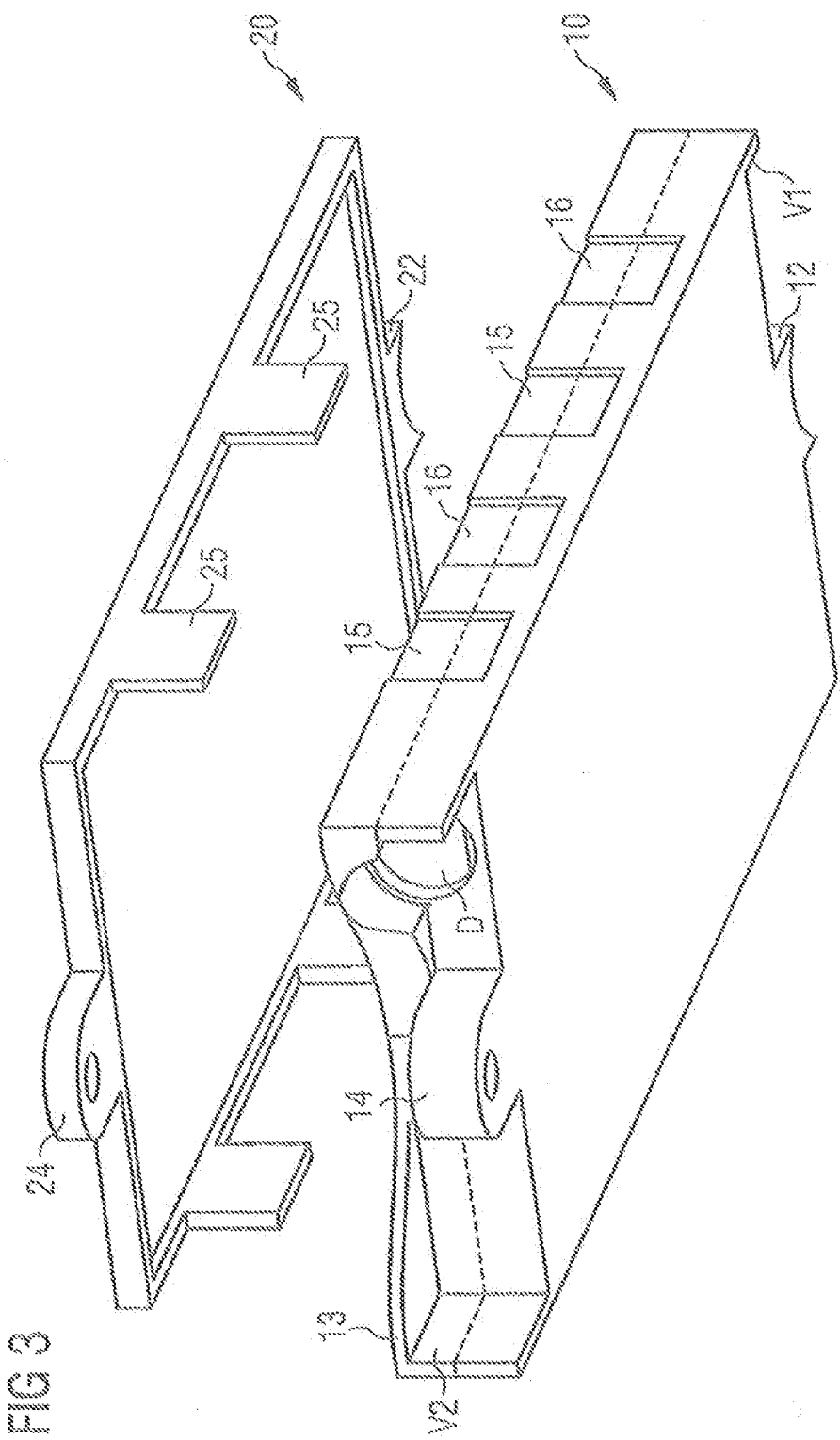

FIGS. 2 and 3 show simplified perspective views of the basic housing module 10 with an associated housing cover 20, in particular for illustrating the details on the front and rear end faces of the basic housing module 10.

According to FIG. 2, two passages D are accordingly formed in the above-described housing indentation V1 which is realized at least on one side of the second connecting plate 12 in the front end face of the basic housing module 10. This enables, for example, an electric plug connection and/or a cable connection on the one hand to a further basic housing module or another type of module (not shown) that is plugged-in in the x or z direction.

According to FIG. 3, however, on the rear end face of the basic housing module 10 at the side next to the fourth connecting plate 14, it is possible for only one passage D to be realized which, however, comprises dimensions of such a type that it also penetrates into the third connecting plate 13. In a similar manner to the indentation V1 that is realized in the basic housing module 10, a further indentation V2, which, with the module in the joined-together state, enables an at least partially closed cavity for a protected plug or cable connection, can also be realized in the third connecting plate 13. For realizing a vertical plug or cable connection, the first and third connecting plates can also comprise passage openings or recesses (not shown). In a similar manner, the bottom and/or the sides of the basic housing module 10 can also comprise passage openings or recesses (not shown), as a result of which, in particular, cable connections between modules are made possible.

FIGS. 2 and 3 also show a housing cover 20 for the basic housing module 10 which can enable a water-tight and/or air-tight covering of the upwardly open basic housing module 10. The electronic circuits or units that are arranged in the basic housing module 10 can be protected reliably from unwanted environmental influences (rain, snow, dust etc.) as a result. In this connection, seals (not shown) can preferably be situated between the basic housing module 10 and the housing cover 20 as well as at the passages D.

In addition, first recesses 15 which, interacting with clamping brackets 25 that are realized on the housing cover 20, enable a rapid fastening of the housing cover 20 on the basic housing module 10, can be realized on the side faces of the basic housing module 10. The clamping brackets 25 as well as the associated first recesses 15 can additionally comprise a latching mechanism which reliably prevents unintentional removal of the housing cover 20 in the z direction. As an alternative to this or in addition to it, the housing cover 20 can also be screw-connected or fixed in another manner to the basic housing module 10.

According to FIGS. 2 and 3, the housing cover 20 can also comprise connecting plates 22 and 24 which, with regard to their form, correspond to the second end fourth connecting plate 12 and 14 of the basic housing module 10. A sandwich structure for the connecting plates, where in each case a large-area connecting plate 11 and 13 is arranged between two small-area connecting plates 12 and 14 as well as 22 and 24, is consequently produced on the end faces in the joined-together state. The housing cover 20 is accordingly secured in addition by the locking element 60 that is pushed into the opening O and the positive locking arrangement of its corresponding connecting plates 22 and 24, as a result of which a suitably accurately fitting and torsion-resistant connection is also produced.

The housing cover 20 preferably has the same width and the same length as the basic housing module 10, its height preferably corresponding to the thickness of the wall or bottom material of the basic housing module 10. In the same way, the same materials as for the basic housing module 10 can also be used.

In addition, second recesses 16, which, interacting with clamping brackets 36 which are realized on a frame module 30 (see FIGS. 4 and 6), once again enable rapid fastening of the frame module 30 on the basic housing module 10, can be realized on the side faces of the basic housing module 10. The clamping brackets 36 as well as the associated second recesses 16 can once again comprise a latching mechanism which reliably prevents unintentional removal of the frame module 30 in the z direction. As an alternative to this or in addition to it, the frame module 30 can also be screw-connected to the basic module housing 10 or the housing cover 20.

Figure 4:
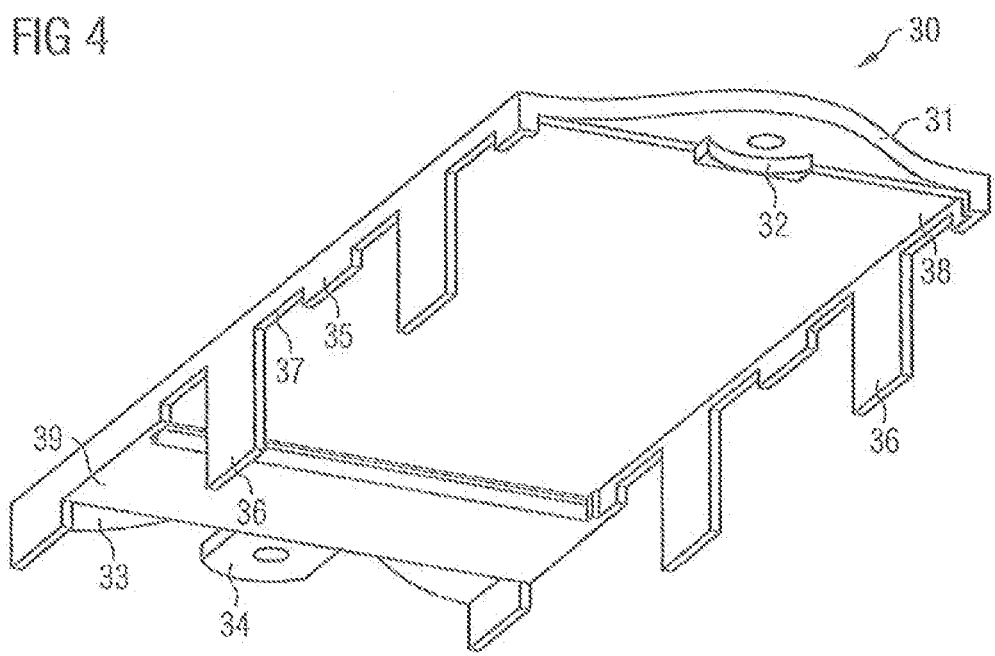
FIG. 4 shows a simplified perspective view of a frame module.

According to FIG. 4, the frame module 30 can comprise, for example, a frame for accommodating a flat electronic component 38. Once again, the frame module 30 can have the same width and same length as the basic housing module 10, its height preferably corresponding to the thickness of the wall or bottom material of the basic housing module 10. In the same way, the same materials can also be used as for the basic housing module 10. To realize a connection in the x direction and z direction, the frame module 30 can comprise on its two end faces in each case two connecting plates 31 and 32 as well as 33 and 34 which, with regard to their form and functionality, correspond to the first to fourth connecting plate 11 to 14 of the basic housing module 10.

For example, the frame module 30 can comprise on its underside a recess 39 for accommodating the housing cover 20, as a result of which an ability for particularly compact stacking is produced in the z direction and, over and above this, additional locking is ensured in the x direction. Together with the clamping brackets 36, the housing cover 20 can be clamped in a play-free manner in the x, y and z direction as a result.

The flat electronic component 38 that is held by the frame module 30 can comprise, for example, an output unit in the form of an LCD display unit or an input unit in the form of a keyboard. So-called touch-sensitive display units can preferably be used as a flat electronic component 38 which enable both an input and output. These types of input/output units are generally known, for example, from the area of smart phones. Over and above this, acoustic input/output units such as, for example, loud speakers and/or microphones can also be used.

The input/output unit serves, for example, for local reading of data, a configuration of the telematics units and/or an authentication.

According to FIG. 4, a solar panel can preferably be installed in the frame module 30 as a flat electronic component 38 in order to ensure the power supply for the electronic circuits and/or to charge an accumulator.

In particular for the case where a solar panel is installed in the frame module 30, it can comprise on its underside ventilation slots 37 which enable ventilation of the solar panel. The ventilation slots 37 can comprise, for example, a height of approximately between 0.5 mm and 2 mm and are preferably defined by the clamping brackets 36 as well as by retaining webs 35 of the frame module 30.

In addition, the frame module 30 can be realized in such a manner that it enables the solar panel or the flat electronic component 38 to be positioned in an angular manner. The angular position is preferably effected in this connection perpendicularly to the direction of transport or movement of the transport container in order to enable self-cleaning of the solar panel. As the indentations of the transport container usually extend perpendicularly with respect to the direction of movement, the frame module 30 preferably enables the solar panel to be positioned in an angular manner in the y direction.

Figure 5:
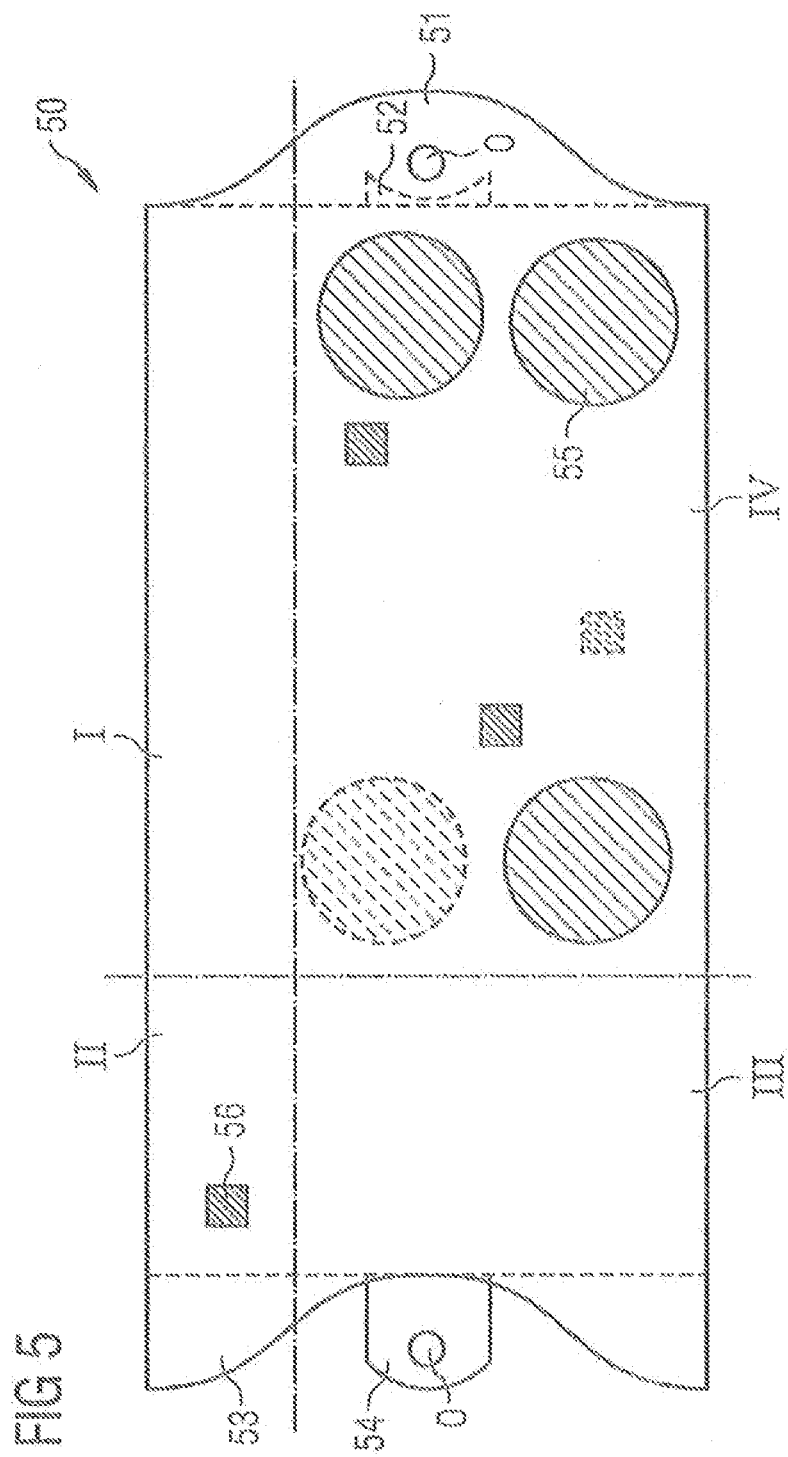
FIG. 5 shows a simplified top view of a fastening module.

FIG. 5 shows a simplified top view of a fastening module 50 which makes it possible to fasten the housing system on an arbitrary supporting surface. The fastening module 50 preferably serves for realizing a fastening of the housing system in an indentation of a transport container. Once again, the fastening module 50 can also comprise the same width and same length as the basic housing module 10, or the housing cover 20 and the frame module 30. In the same way, the same materials as for the basic housing module 10 can also be used. To realize a connection in the x and z direction, the fastening module 50 can once again comprise on its two end faces in each case two connecting plates 51 and 52 as well as 53 and 54 which, with regard to their form and development, correspond to the first to fourth connecting plate 11 to 14 of the basic housing module 10.

The fastening module 50 can comprise, for example, a plurality of proximity sensors 56 which enable the detecting of a supporting surface. These types of proximity sensors 56 can comprise, for example, ultrasound sensors, optical sensors, capacitive sensors and/or magnetic censors which are arranged in such a manner in the fastening module 50 that they detect the fastening module 50 being moved away from the supporting surface. In addition, mechanical keys can be provided as proximity sensors 56. In this way, for example, an alarm can be triggered and transmitted to the central data processing unit which, for example, signals a non-authorized removal (theft) of the fastening module 50 or of the housing system fastened thereon.

According to FIG. 5, the fastening module 50 can be divided into four quadrants I, II, III and IV, proximity sensors 56 only being arranged in the quadrants II and IV which are arranged in a point-symmetrical manner with respect to one another. An arrangement of this type enables, along with the above-described alarm function for signaling a non-authorized removal of the fastening module 50, in addition a signaling of a door status (open/closed). More precisely, the fastening module 50 can be mounted in such a manner on a door or a fixed wall of the transport container that it overlaps a (further) door of the transport container by way of its free end (quadrants II and III). The proximity sensor 56 in the second quadrant II can, in this case, signal whether a door of the transport container is open. In this way, a non-authorized opening of the transport container can be directly detected and transmitted to the data processing unit and/or a local alarm can be triggered.

According to FIG. 5, the fastening module 50 can comprise at least one fastening element 55 which serves for fastening the fastening module 50, and consequently the housing system, on the supporting surface or transport container. For example, magnets, suction cups and/or adhesive elements are used as fastening elements 55 by way of which the fastening module 50 can be fastened releasably on the supporting surface or transport container. In particular for determining the door status, all the fastening elements 55 are arranged only in one quadrant IV in which the proximity sensors for the anti-theft alarm are also situated. Three or four fastening elements are preferably arranged in the fourth quadrant IV and at least 2 proximity sensors 56, as a result of which increased mechanical stability is produced and the probability of false alarms is reduced.

According to FIG. 5, the proximity sensors 56 are all offset with respect to one another in the transverse direction, as a result of which even a jagged adhesive point or support surface (small corrugations) can be tested in a reliable manner as to whether the module is still fastened on the supporting surface or not. A false alarm can be reliably prevented as a result of evaluating the combination of the proximity sensors 56 or fastening censors.

In the case of such a division of the fastening elements at and proximity sensors 56, the fastening module 50 can be used both for horizontally aligned doors and vertically aligned doors of a transport container.

FIG. 6 shows a simplified perspective view of a housing system according to a first exemplary embodiment of the present invention, identical references designating identical or corresponding elements as in FIGS. 1 to 5, which is why repeated description below is omitted.

According to FIG. 6, the fastening module 50 is fastened, for example, in an indentation (not shown) of a transport container. A basic housing module 10, a housing cover 20 and a frame module 30 can be connected to the fastening module 50 and consequently to the transport container or stacked in the z direction by means of the connecting system which consists of the respective connecting plates as well as the locking element 60. In addition, extension in the x direction (not shown) is also possible. The housing system can consequently combine a plurality of different housing modules together in an arbitrary manner, as a result of which an optimum housing can be configured for each application. The plug connections, in this connection, are extremely sturdy and simple to handle during assembly.

In addition, according to FIG. 6, a cover module 40 can be provided for realizing mechanical protection. The cover module 40, in this connection, can comprise substantially the dimensions of the basic housing module 10, or of the housing cover 20 or of the frame module 30 in the x and y direction, it not having to comprise any connecting plates, but just has the at least two openings O at the suitable point for inserting the locking element 60. A transparent Plexiglas sheet is preferably used for the cover module 40.

FIG. 7 shown a simplified perspective view of a housing system according to a further exemplary embodiment of the present invention, identical references designating identical or corresponding elements as in FIGS. 1 to 5, which is why repeated description below is omitted.

According to FIG. 7, the fastening module 50 is fastened once again in an indentation (not shown) of a transport container, it consisting, however, substantially of a rectangular fastening plate which is connected fixedly to the transport container via rivets, screws or adhesion. As the cover module 40 of the first exemplary embodiment, the fastening module 50 is developed in this case as a rectangular plate with at least two openings into which the locking elements 60 can be inserted.

The housing system according to FIG. 7 can once again combine a plurality of different housing modules together in an arbitrary manner, as a result of which an optimum housing can be configured for each application. The fastening module, in this connection, can bee realized in a particularly cost-efficient manner with a small height. The fastening module 50 can comprise, for example, the dimensions (in the x and y direction) of the further modules although it preferably has a length in particular that corresponds to the definitive housing system.

According to FIG. 7, the modular housing system can also be realized without a cover module if additional mechanical protection is not necessary.

The invention has been described above by way of preferred exemplary embodiments. However, it in not limited thereto and also includes, in particular, combinations of the aforedescribed exemplary embodiments. In particular, basic housing modules with a housing cover can be combined multiple times, individual operating modules (frame module with different operating units, fastening module, etc.) also being able to be arranged multiple times one on top of another and/or side by side.

Although semi-circular connecting plates according to the invention with concave and convex end faces which in each case mesh in one another in a positive locking manner are described, it is also possible to use angular forms for the connecting plates.

The invention claimed is:

1. A modular housing system for accommodating electronic circuits, said modular housing system having at least one basic housing module (10) which comprises two oppositely located end faces, wherein
    a first connecting plate (11) is realized in a first plane on the first end face and a second connecting plate (12) is realized in a second plane which is different from the first plane;
    a third connecting plate (13) is realized in the first plane on the second end face and a fourth connecting plate (14) is realized in the second plane, wherein
    in each case the first and third connecting plate (11, 13) as well as the second and fourth connecting plate are formed on their end faces in such a manner that positive locking can be realized at least in part, and
    the first and fourth connecting plate (11, 14) comprise in each case at least one opening (O) into which in each case a locking element (60) can be introduced.

2. The modular housing system as claimed in claim 1, wherein the first and fourth connecting plate (11, 14) comprise in each case a convex form and the second and third connecting plate (12, 13) comprise in each case a concave form.

3. The modular housing system as claimed in claim 1, wherein, in addition, at least one passage (D) is realized between adjacent modules on the end faces of the basic housing module (10) for realizing an electrical plug connection and/or a cable duct.

4. The modular housing system as claimed in claim 3, wherein at least one of the end faces of the basic housing module (10) comprises an indentation (V1, V2), in which at least one passage (D) is realized.

5. The modular housing system as claimed in claim 1, wherein the first and second connecting plate (11, 12) as well as the third and fourth connecting plate (13, 14) are arranged directly one above one another.

6. The modular housing system as claimed in claim 1, wherein at least one accommodating means for an accumulator, a GPS module, a radio module and/or a printed circuit hoard is realized in the basic housing module (10).

7. The modular housing system as claimed in claim 1, wherein the at least one locking element (60) provides a thru shaft with a circular, oval or polygonal cross-section.

8. The modular housing system as claimed in claim 1, wherein there is additionally provided a housing cover (20) which covers the housing module (10), wherein, on its end faces, the housing cover (20) comprises in each case only one connecting plate (22, 24) which, with regard to its form, corresponds to the second and fourth connecting plate (12, 14).

9. The modular housing system as claimed in claim 8, wherein the basic housing module (10) comprises on its side faces at least one first recess (15) and the housing cover (20) comprises at least one associated clamping bracket (25), wherein the housing cover (20) is fastened on the basic housing module (10) as a result engaging the at least one clamping bracket (25) in the at least one recess (15) of the basic housing module (10).

10. The modular housing system as claimed in claim 1, wherein in addition a frame module (30) is provided for accommodating a flat electronic component (38), wherein the frame module comprises on its end faces in each case two connecting plates (31, 32, 33, 34), which, with regard to their form, correspond to the first to fourth connecting plate (11, 12, 13, 14).

11. The modular housing system as claimed in claim 10, wherein the basic housing module (10) additionally comprises on its side faces at least one second recess (16) and the frame module (30) comprises at least one associated clamping bracket (36), wherein the frame module (30) is fastened on the basic housing module (10) as a result of engaging the at least one clamping bracket (36) in the at least one recess (16) of the basic housing module (10).

12. The modular housing system as claimed in claim 10 wherein the frame module (30) additionally comprises a recess (39) for accommodating the housing cover (20).

13. The modular housing system as claimed in claim 10, wherein the flat electronic component (38) provides an output unit and/or an input unit.

14. The modular housing system as claimed in claim 10, wherein the flat electronic component (38) comprises a solar panel and the frame module (30) additionally comprises ventilating slots (37) for venting the solar panels.

15. The modular housing system as claimed in claim 1, wherein there is additionally provided a cover module (40), in particular a Plexiglass sheet, for realizing mechanical protection which compromises at least two openings (0) into which in each case the locking element (60) can be introduced.

16. The modular housing system as claimed in claim 15, wherein the fastening module (50) comprises on its end faces in each case two connecting plates (51, 52, 53, 44), which, with regard to their form correspond to the first to fourth connecting plate (11, 12, 13, 14).

17. The modular housing system as claimed in claim 1, wherein there is additionally provided a fastening module (50) for realizing a fastening of the housing system on supporting surface, said fastening module comprising at least two openings (0) into which in each case the locking element (60) can be introduced.

18. The modular housing system as claimed in claim 17, wherein the fastening module (50) comprises proximity sensors (56) for detecting a presence of the supporting surface and fastening elements (55) for fastening the fastening module (50) to the support surface.

19. The modular housing system as claimed in claim 18, wherein the fastening module (50) is divided into four quadrants (I, II, III, IV) and all of the fastening elements (55) are arranged in a predetermined quadrant (IV).

20. The modular housing system as claimed in claim 18, wherein at least two proximity sensors (56) are arranged in the predetermined quadrant (IV) and at least one proximity sensor (56) is arranged in the quadrant (II) that is located opposite in a point symmetrical manner.

21. The modular housing system as claimed in claim 18, wherein the fastening elements (55) comprise magnets, suction cups and/or adhesive elements.

\* \* \* \* \*